United States Patent [19]

Nishioka

[11] 4,103,814

[45] Aug. 1, 1978

[54] CHIP BONDING UNIT

[75] Inventor: Hideya Nishioka, Yokohama, Japan

[73] Assignee: Fujitsu Limited, Japan

[21] Appl. No.: 683,730

[22] Filed: May 6, 1976

[30] Foreign Application Priority Data

Oct. 5, 1975 [JP] Japan ................... 50-56621

[51] Int. Cl.² .......................................... H01L 21/60
[52] U.S. Cl. ...................................... 228/6 A; 228/9;
228/180 A; 318/640
[58] Field of Search .................... 228/6 A, 9, 10, 102,
228/105, 180 A; 318/603, 640, 577

[56] References Cited

U.S. PATENT DOCUMENTS

| 3,394,293 | 7/1968 | Taniguchi et al. | 318/640 X |
| 3,466,514 | 9/1969 | Brunner et al. | 318/640 X |
| 3,581,375 | 6/1971 | Rottmann | 228/102 X |
| 3,695,501 | 10/1972 | Radobenko | 228/6 A X |
| 3,943,359 | 3/1976 | Matsumoto et al. | 318/640 X |

Primary Examiner—Donald G. Kelly
Assistant Examiner—K. J. Ramsey
Attorney, Agent, or Firm—Staas & Halsey

[57] ABSTRACT

Disclosed herein is a chip bonding unit including a collet for holding a semiconductor chip, a table or bed for mounting the chips and a working table for holding a base plate to which the chip is to be attached, said collet being capable of relative movement with respect to the bed and the working table. In the chip bonding system according to the present invention, a light source and a light receiving element are disposed for detecting a silhouette of the chip by means of the scanning of the surface of said chip by the light source so as to thereby confirm the configuration, position and angle of the chip. The relative motion of the collet and chip is controlled so that the chip comes to a normal position and, then, the chip is picked up by the collet. Finally, the relative position of the collet and the working table is controlled so that the chip is attached to a predetermined position on the base plate.

10 Claims, 18 Drawing Figures

Fig. 4A SCW 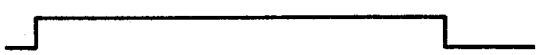
Fig. 4B BPP 
Fig. 4C PNO 
Fig. 4D DFP 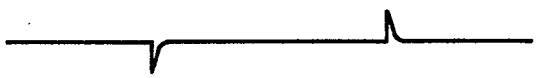
Fig. 4E UPGC 
Fig. 4F DWNC 
Fig. 4G UPP 
Fig. 4H DWNP 

CHIP BONDING UNIT

This invention relates to a chip bonding unit for automatically carrying out the so-called chip bonding operation for attaching a semiconductor chip to a base plate such as a lead frame or stem.

In the conventional chip bonding unit, the bonding operation has been customarily carried out manually; that is, generally, in the conventional chip bonding operation, an operator moves and rotates a plane mirror mounting bed while observing directly or with a microscope and comparing an image of a collet tip end reflected in the plane mirror with the chip randomly placed on the plane mirror mounting bed. This enables the operator to position the chip so that it correctly faces the tip end suction portion of the collet, and attach the chip to the collet. After that the collet is displaced onto the base plate to attach the chip thereon.

As stated above, under conventional methods, the chip picking-up operation is carried out with the naked eye or with a microscope. Further, the attaching operation of the chip to the base plate is also carried out with the naked eye or with a microscope. Therefore, the above-mentioned manual chip bonding operation has the defect that it is impossible to expect a high level of accuracy and speed in the operation.

In order to eliminate the above-mentioned defect, one of the following chip bonding apparatus may be utilized. With one of said chip bonding apparatus, the naked eye is used in picking up the chip in the same manner as mentioned above; however, the chip is automatically attached at a predetermined position of the base plate by maintaining the base plate at a predetermined position with respect to the collet. Another chip bonding apparatus used practically is a semi-automatic chip bonding apparatus. Said semi-automatic chip bonding apparatus is provided with an improved pick-up portion and uses a wafer which is attached to a sheet after being scribed and is enlarged, wherein chips are arranged with some regularity. This semi-automatic apparatus can successively carry out semi-automatic chip picking up operations according to a predetermined program, if any of the chips are positioned with the naked eye so as to correctly face the collet. However, with this semi-automatic apparatus, the chips on the sheet are not arranged in general in a straight line with equal spaces therebetween, and positioned in the same direction. Instead, they are arranged in a gently curved line, with unequal spaces therebetween, and positioned in slightly different directions. Therefore, a perfect function of such an automatic pick-up system cannot be effectuated.

The principal object of the present invention is to provide a practical apparatus for automatically and continuously carrying out a series of operations such as the selecting and picking up operations of a chip from a wafer, and the attaching operation of the chip to the base plate, without requiring any manual operation, by detecting the position, configuration and direction of the chip on the extended sheet, positioning the chip so that it correctly faces the collet, securely picking up the chip with the collet without being restricted by an irregular chip arrangement, positioning the chip at a predetermined position on the base plate, and, finally, bonding the chip to the base plate.

For achieving the above-mentioned object, the present invention discloses a chip bonding unit including a collet for holding a semiconductor chip, a table or bed for mounting the chips, and a working table for holding a base plate to which the chip is to be attached, wherein the collet is capable of relative movement with respect to the bed and the working table. The characteristic features of the present invention are that a light source and a light receiving element are disposed with a wafer attached to a sheet intervening therebetween, so as to detect a silhouette of the chip produced by light passing through the sheet, thereby confirming the configuration position, and angle of the chip. The relative motion of the collet and chip is controlled so that the chip comes to a normal position and, then, the chip is picked up by the collet. Finally, the relative position of the collet and the working table is controlled so that the chip is attached to a predetermined position on the base plate.

Further features and advantages of the present invention will be apparent from the ensuing description with reference to the following described accompanying drawings to which, however, the scope of the invention is no way limited:

FIGS. 4A through 4H are explanatory diagrams of the control circuit of FIG. 3;

Figure 1:
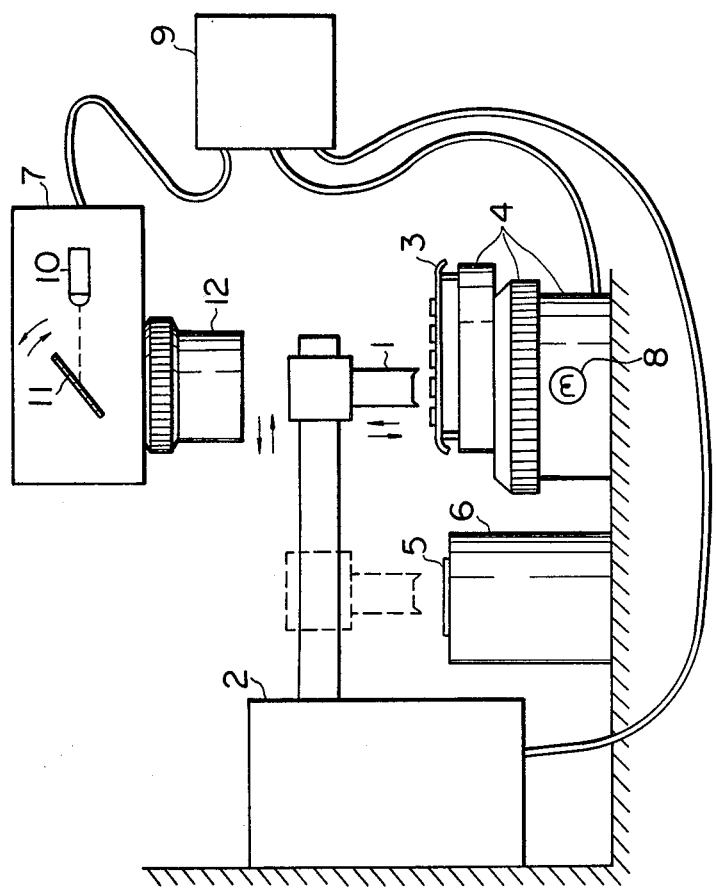
FIG. 1 is a constructional diagram of a chip bonding unit according to the present invention.

FIG. 1 is one embodiment of a construction of a chip bonding unit according to the present invention. The apparatus comprises a collet 1 for holding and attaching chips to a base plate 5, a mechanism 2 for imparting a predetermined motion to the collet 1, an extended sheet 3 for attaching a wafer, a mounting bed 4 for carrying the sheet 3 and being capable of moving and turning in a horizontal plane, a working table 6 for holding the base plate 5 such as a lead frame or stem to which the chip is to be attached, an optical detecting portion 7 for detecting the position, configuration and angle of the chip on the extending sheet 3, a light source 8, and a control portion 9. In this embodiment, the working table 6 is fixed onto the bottom of the apparatus. The collet 1 is capable of reciprocally moving between a rotational center of the mounting bed 4 and a predetermined bonding position of the base plate 5 on the working table 6, so that the chip picking up operation and the chip bonding operation can be continuously carried out. Since the extension rate of the extended sheet 3 is not strictly uniform, the chips to be picked up from the sheet at the center portion of the sheet are generally arranged in an approximately straight line, with equal spaces therebetween, and positioned in the same direction; however, in the peripheral portion of the sheet, the chips are arranged on a gently curved line, with unequal spaces therebetween, and positioned in different directions. Consequently, if the movement of the mounting bed 4 is controlled to carry out a positioning operation with respect to the above-mentioned extended sheet 3, assuming that the chips are all arranged in the straight line with equal spaces therebetween, the positional relationship between the collet 1 and the chips gradually shifts, so that a correct picking up operation cannot be carried out.

In order to eliminate the above-mentioned defect, the following unit is employed in the present invention. That is, the center of the chip to be picked up is correctly positioned so that it coincides with the center of the collet 1. Then, the mounting bed 4 is rotated so that the chip correctly faces the collet 1 and, next, the picking up operation is carried out. For this purpose, in this embodiment, the light source 8 and the optical detecting portion 7 are separately disposed on the two sides of the extended sheet 3 which is made of a transparent or translucent material. When light emitted from the light source 8 is interrupted by the chip on the sheet 3 mounted on the bed 4, a silhouette of the chip is produced. The center of the chip on the sheet 3 is positioned so that it coincides with the rotational center of the mounting bed. This is accomplished by linearly scanning (by means of the optical detecting portion 7) the surface of the chip and detecting the silhouette of the chip; confirming the lower portion of an output signal level corresponding to a chip region; comparing this with a signal, such as a clock pulse, which corresponds to the scanning of the rotational center of the bed; and controlling the scanning of the chip so that the center of the chip region always coincides with the rotational center of the bed.

The optical detecting portion 7 comprises a light receiving element 10 for detecting the light emitted from the light source 8, a vibrating reflection mirror of glass 11 for scanning the chip, and an objective mirror or glass 12 having a predetermined magnifying power. The light receiving element 10 is placed on an image focus plane of the objective glass 12.

Figure 2A:
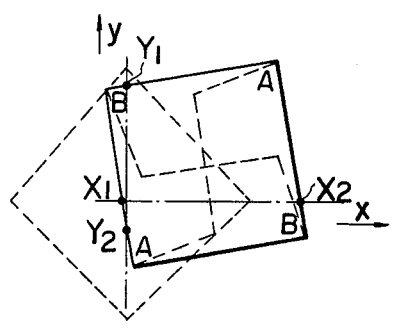
FIGS. 2A through 2F are conditions of the chip being bonded, waveforms of the chip being scanned and detected, and locuses of the center of a collet on the chip when positioning control operations of the bed are carried out.
Figure 2D:
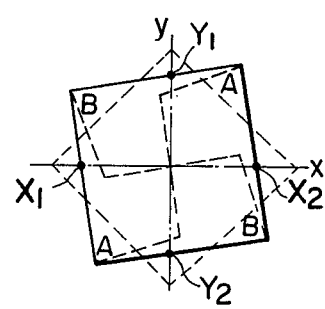
Figure 2B:
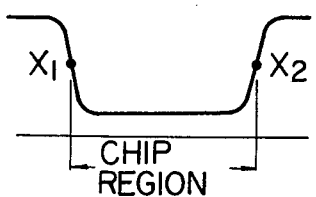
Figure 2E:
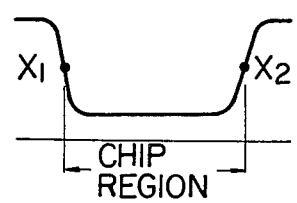
Figure 2C:
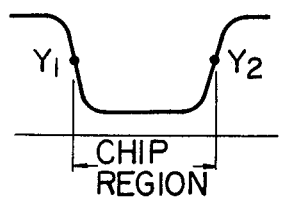
Figure 2F:
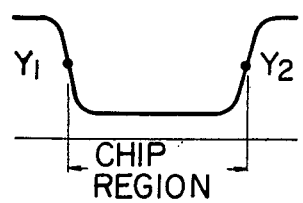

An example showing conditions of the chip and corresponding detected waveforms when the above-mentioned system is employed is shown in FIGS. 2A through 2F. FIG. 2A shows a condition of a chip disposed at an arbitrary position; FIGS. 2B and 2C show waveforms of said chip being scanned along two orthogonal axes x and y passing through the rotational center of the mounting bed, respectively; FIG. 2D shows a condition of the chip when its center coincides with the rotational center of the bed; and FIGS. 2E and 2F show waveforms of said chip of FIG. 2D being scanned along the above-mentioned x and y axes, respectively.

The center of the chip region ($X_1$ - $X_2$) along the X axis can be positioned at the rotational center of the mounting bed displacing along the x axis, irrespective of its position along the y axis, by controlling the movement of the mounting bed along the x axis. That is to say, the chip is moved so that the clock pulse which corresponds to the instant of the rotational center of the mounting bed along the x axis is generated at the time when the center of the chip region ($X_1$ - $X_2$) is being scanned.

Broken line A—A in FIG. 2A shows a locus of the center of the chip region in the horizontal direction.

In the same manner as above, the center of the chip region ($Y_1$ - $Y_2$) along the y axis can be positioned at the rotational center of the mounting bed displacing along the y axis, irrespective of its position along the x axis, by controlling the movement of the mounting bed along the y axis. That is to say, the chip is moved along the y axis so that the clock pulse which corresponds to the instant of the rotational center of the mounting bed along the y axis is always generated at the time when the center of the chip region ($Y_1$ - $Y_2$) is being scanned.

Broken line B—B in FIG. 2(A) shows a locus of the center of the chip region in the vertical direction.

By carrying out the above-mentioned control of the positioning of the mounting bed along both the x and y axes at the same time, the mounting bed stops at a point satisfying predetermined positioning conditions for both the x and y axes. That point is the center of the chip, which is the intersecting point of the broken lines A—A and B—B, and which coincides with the rotational center of the mounting bed.

Figure 3:
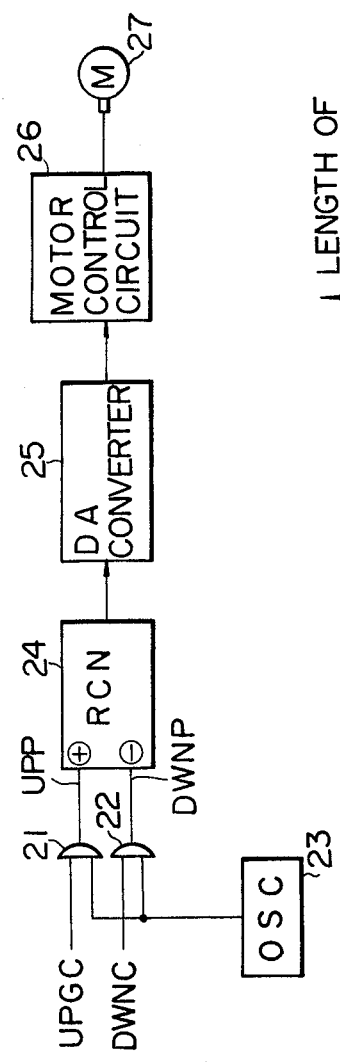
FIG. 3 is a control circuit used to position the center of the chip so that it coincides with the rotational center of the bed.

FIG. 3 shows an embodiment of the control circuit 9 of FIG. 1, which circuit is used to position the center of the chip so that it coincides with the rotational center of the mounting bed, and FIGS. 4A through 4H are explanatory diagrams of waveforms generated in the control circuit of FIG. 3. In FIG. 4A, a signal SCW represents a scanning pulse, and its scanning pulse width indicates an observable range of the vibrating reflection mirror 11. A signal BPP shown in FIG. 4B is a pulse showing the rotational axial center position of the mounting bed 4 (FIG. 1). Since a rotating shaft of the mounting bed is fixed, this pulse always appears after a predetermined time $ta$ from after the commencement of the scanning operation. A signal PNO shown in FIG. 4C is an output signal of the light receiving element 10 shown in FIG. 1. A signal DFP shown in FIG. 4D is a differential signal obtained by differentiating the output signal PNO of the light receiving element 10. A signal UPGC shown in FIG. 4E is a first gate signal having a binary value "1" during a period between the generation of a falling pulse DFP and the generation of the above-mentioned pulse BPP. A DWNC shown in FIG. 4F is a second gate signal having a binary value "1" during a period between the generation of the above-mentioned pulse BPP and the generation of a rising differential signal DFP.

Referring to FIGS. 1 and 3, when the scanning operation along the x axis is commenced, the light receiving element 10 generates the output PNO, and the first gate signal UPGC becomes a binary value "1" and opens an AND gate 21. Thus, high frequency pulses from an oscillator 23 are introduced to an addition terminal of a reversible counter (RCN) 24 via the gate 21, as pulses UPP (FIG. 4G), and are counted and stored therein. When the scanning operation along the x axis exactly reaches the rotational axial center position of the mounting bed, the pulse BPP indicating the rotational axial center position appears and the logical value of the first gate signal UPGC, becomes "0" while the logical value of the second gate signal DWNC becomes "1." Thus, the AND gate 21 closes while an AND gate 22 opens, and the high speed pulses from the oscillator 23 are introduced to a subtraction terminal of the reversible counter (RCN) 24 and its content being downcounted or subtracted therein. When the scanning operation of the chip piece is finished, the differential pulse DFP (FIG. 4D) is again produced and, thereby, the gate 22 is closed. As a result of this, the reversible counter RCN stores the number of the pulses corresponding to a difference between the value of the distance between the one end of the chip and the rotational axial center position, and the valve of the distance between the other end of the chip and the rotational axial center position.

Said number of the pulses is proportionally converted to an analog amount by a digital-to-analog (DA) converter 25, and the resulting analog signal is supplied to a motor control circuit 26 to drive a motor 27 for the x axis in a direction so that the error, that is, the content of the counter, becomes zero. The above-mentioned positioning control operation is repeated until the chip center, coincides with the rotational axial center and the positioning operation along the x axis is completed.

In the case of the y axis scanning operation, quite a similar control operation to the above x axis scanning operation is carried out. That is, an automatic positioning operation along the y axis is carried out so that the center of the chip region viewed along the y axis comes to the rotational axial center of the mounting bed. As a result of this, the center of the chip region on both the x and y axes, that is, the chip center, is correctly coincident with the rotational axial center. Thereafter, the mounting bed is automatically turned so that the position of the chip exactly coincides with the position of the collet. Although various methods can be utilized for attaining the above-mentioned automatic positioning operation, in this embodiment, this operation is attained by constructing the portion of the collet which holds the chip so that it has the same configuration as the chip, and by controlling the rotation of the mounting bed so that one of the diagonals extending from one corner to the opposite corner of the chip coincides with this scanning line.

Figure 5:
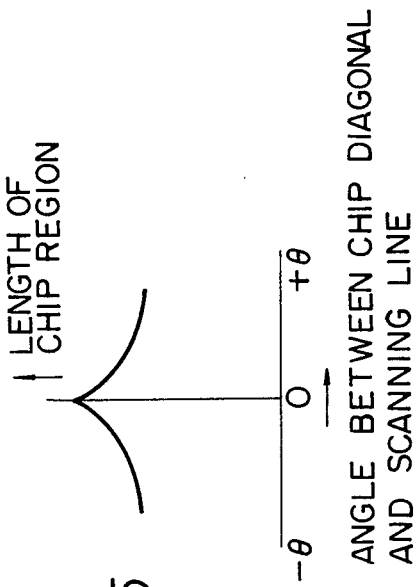
FIG. 5 is a graph illustrating a detected waveform for matching the rotating direction of the chip.

FIG. 5 is a graph illustrating the length of the chip region, which is obtained from the scanning detection waveform as a function of the angle between the above-mentioned diagonal extending from one corner to the opposite corner of the chip and the scanning line. As is clear from the graph shown in FIG. 5, this method utilizes the fact that the maximum length of the chip region lies at a position where the above-mentioned diagonal coincides with the scanning line, and a driving motor of the mounting bed is controlled so that this value becomes maximum.

Figure 6:
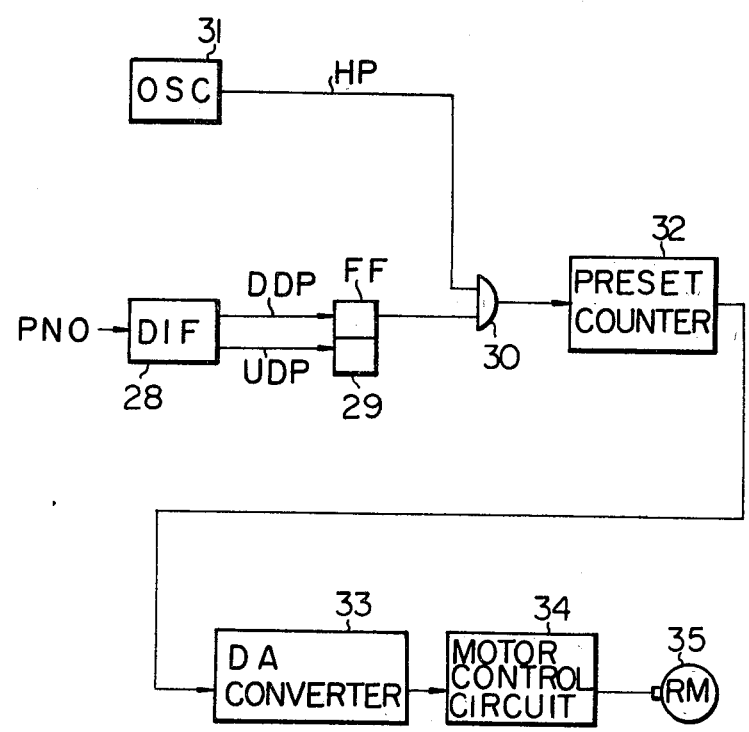
FIG. 6 is a control circuit used to position the chip diagonal line so that it coincides with one of the scanning lines.

FIG. 6 is an embodiment of a control circuit used to position one of the diagonals extending from one corner to the opposite corner of the chip so that it coincides with one of the scanning lines. A number of pulses corresponding to the maximum length of the chip region is preliminarily put in a preset counter 32. Now, assuming that the output signal PNO shown in FIG. 4C is generated from the light receiving element 10 of FIG. 1 by the scanning operation along the x-axis, this output signal is differentiated by a differentiator (DIF) 28, and a flip-flop (FF) 29 is set by a falling differential pulse DDP. Thus, an AND gate 30 is opened, while a high speed output pulse HP from an oscillator 31 is impressed on a substraction terminal of the preset counter 32 via the AND gate 30 so that the content of the counter PSC 32 is successively down-counted. When the scanning operation of the chip surface is finished, a rising differential pulse UDP is produced from the differentiator 28 and, thereby, the flip-flop 29 is reset and the AND gate 30 is closed. As a result of this, the content of the preset counter 32 shows a deviation between the maximum length of the chip region and the cut length of the chip along the x-axis (length between $X_1$ and $X_2$ in FIG. 2D). Since this deviation corresponds to the angle between one of the diagonals extending from one corner to the opposite corner of the chip and the scanning line, this deviation is converted by a DA converter 33 to an analog voltage which is proportional to said deviation, and this analog voltage is supplied to a motor control circuit 34 to drive a rotation control motor 35, thereby to turn the mounting bed, so that the above-mentioned diagonal of the chip coincides with one of the scanning lines.

Said rotating control of the mounting bed is repeatedly carried out until the above-mentioned diagonal correctly coincides with the scanning line.

As stated heretofore, once the chip correctly faces the collet 1 (FIG. 1), which is also correctly positioned at the center of the mounting bed 4, the chip is picked up by the collet 1. Following this, the collet 1 is positioned at the predetermined point on the base plate 5 of the working table 6 and presses the chip against the base plate, so as to form co-crystallization between the surface material of the base plate and the chip material, thus bonding the chip to the base plate 5. After completing a series of operations for a piece of chip, such as the selection, positioning, angle-matching, picking up and bonding operations, the collet 1 is returned to the rotational center of the mounting bed 4 and repeats the same operations for the next chip on the mounting bed 4.

The automatic chip bonding apparatus for bonding a semiconductor, according to the present invention, has heretofore been explained in detail. However, the invention is not limited to the construction of a stationary working table and a collet displaceable relatively with respect to the mounting bed as described in the above-mentioned embodiment, but includes any construction capable of carrying out similar relative movements between the collet, working table and mounting bed. Further, the scanning operation for confirming the chip region is not limited to the mechanical scanning system as utilized in the above described embodiment, but may be carried out by, for example, an electronic scanning system with an image pick-up tube.

As already stated, the series of operations beginning with the picking up of an individual chip from the wafer, which chip is attached onto the sheet and extended after being scribed, and ending with the bonding of the chip to the base plate, can assuredly be carried out automatically and continuously, without manual labor, by positioning the individual chip so that it correctly faces the collet and, positioning the collet exactly at the predetermined pick-up position and bonding position.

I claim:

1. A chip bonding unit including a collet for holding a semiconductor chip having a silhouette, a mounting bed for mounting semiconductor chips, and a working table for holding a base plate to which the chip is to be attached, said collet having variable relative positions with respect to said mounting bed and said working table, respectively; said unit further comprising:
   a light source for generating a light beam and for scanning the surface of said chip therewith so as to define a scanning line, and a light receiving element on a side of said chip remote from said light source for receiving said light beam so as to detect, by non-reception of light, the silhouette of said chip;
   means for controlling the relative position of said collet and chip in accordance with said detection of said silhouette so that said chip comes to a normal position relative to said collet;
   means responsive to said chip being at said normal position for actuating said collet to pick up said chip; and
   means for controlling the relative position of said collet and said working table so as to place said chip in a predetermined position relative to said working table, and including means for attaching said chip to said base plate;

said means for controlling the relative position of said collet and said chip including means for rotationally reorienting said chip relative to said collet so that one of the diagonals extending from one corner to the opposite corner of said chip coincides with said scanning line defined by said surface scanning of said light source.

2. A chip bonding unit according to claim 1, wherein said means for controlling the relative position of said collet and said chip comprises:

means for positioning the center of said chip so that said center coincides with the rotational center of said mounting bed; and means for turning said mounting bed so that said chip correctly faces said collet.

3. A chip bonding unit according to claim 2, wherein said means for positioning the center of said chip with the rotational center of said mounting bed comprises:

a high frequency oscillator providing high frequency pulses;

a reversible counter for receiving, and up-counting in accordance with said high frequency pulses during the period between the beginning of detection of the silhouette and the detection of the rotational axial center position of said mounting bed, said reversible counter functioning to down-count in accordance with said high frequency pulses during the period between the detection of said rotational axial center position and the detection of the end of said silhouette;

a digital-to-analog converter which converts the content of said reversible counter to an analog value;

a motor for driving said mounting bed to alter the relative positioning of said chips relative to said collet; and a motor control circuit responsive to said digital-to-analog converter for driving said motor so that the output of said digital-to-analog converter becomes zero indicating positioning of the center of said chip coincident with the rotational center of said mounting bed.

4. A chip bonding unit according to claim 1, wherein said means for turning said mounting bed comprises:

a preset counter which is preliminarily preset to a value corresponding to the length from one corner to the opposite corner of said chip, and which down-counts from said value at a constant speed during the period that the silhouette is detected by the light receiving element;

a digital-to-analog converter which converts the content of said preset counter to an analog value;

a motor for turning said mounting bed to effect reorientation of said one of said diagonals relative to said scanning line; and a motor control circuit for driving said motor so that the output of said digital-to-analog converter becomes zero, whereby said one of said diagonals is made to coincide with said scanning line.

5. In a chip bonding unit for bonding semiconductor chips, wherein each successive chip to be bonded is opaque to light and is disposed in a pickup area prior to pickup for bonding by a collet; an apparatus for adjusting the center-positioning of each successive chip in said pickup area, comprising in combination:

a mounting bed having a overlying laterally adjustable sheet for holding said chips to be bonded, said bed having a vertical axis defining a center of said pickup area on said sheet;

means for laterally scanning said pickup area with a light beam along at least one predetermined axis thereof;

means for receiving said light beam and responsive thereto for producing an output signal waveform indicating the positioning of the silhouette of said chip in the light beam path in said pickup area;

control circuit means responsive to said output signal waveform for correlating the positioning of the silhouette of said chip in said pickup area with the center of said pickup area to issue a control signal indicating a lateral distance between the center of said chip and the center of said pickup area; and motor means coupled to said control circuit means and operatively associated with said mounting bed for moving the said adjustable sheet so as to modify the lateral positioning of said sheet in accordance with said control signal from said control circuit means, whereby to adjustably reduce said lateral distance between the center of said chip and the center of said pickup area.

6. In the chip bonding unit of claim 5 wherein said control circuit means comprises:

means for detecting a first transition in said output signal waveform indicating interruption of the scanning light beam by said chip, and for detecting a second transition in said output signal waveform indicating detection of the scanning light beam;

counting means associated with said detecting means for up-counting in accordance with a predetermined rate upon detection of said first transition;

means associated with said counting means for causing said counter means to down-count a predetermined time interval, corresponding to the expected scanning of the center of said pickup area, after commencement of scanning by said scanning means;

said counting means being responsive to the detection of said second transition for stopping counting and providing its contents as a digital output; and converting means for converting said digital output of said counting means to an analog signal comprising said control signal for said motor means.

7. In the chip bonding unit of claim 5 wherein said detecting means is a differentiation circuit.

8. In a chip bonding unit for bonding semiconductor chips having a predetermined silhouette, wherein each successive chip to be bonded is opaque to light and is disposed in a pickup area prior to pickup for bonding by a collet also having said predetermined silhouette, each successive chip being further disposed in said pickup area so that the center of each successive chip coincides with the center of said pickup area; an apparatus for rotatably adjusting the orientation of each successive chip in said pickup area, comprising in combination:

a mounting bed rotatable about a fixed vertical axis and having an overlying adjustable sheet for holding said chips to be bonded, said vertical axis defining the center of said pickup area on said sheet;

means for laterally scanning said pickup area with a light beam along at least one predetermined axis thereof;

means for receiving said light beam and responsive thereto for producing an output signal waveform indicating the positioning of said chip in the light beam path in said pickup area;

control circuit means responsive to said output signal waveform for correlating the orientation of said chip in said pickup area with the orientation of said collet to issue a control signal indicating a rotational difference between the orientation of said chip and the orientation of said collet; and motor means coupled to said control circuit means and operatively associated with said mounting bed for rotating said mounting bed about said fixed axis to adjust the orientation of said sheet in accordance with said control signal from said control circuit means, whereby to adjustably reduce the rotational difference between the orientation of said chip and the orientation of said pickup area.

9. In the chip bonding unit of claim 8 wherein said control circuit means comprises:

means for detecting a first transition in said output signal waveform indicating interruption of the scanning light beam by said chip, and for detecting a second transition in said output signal waveform indicating detection of the scanning light beam;

pre-set counting means, initially set to a predetermined value representing the expected scanning time from one side of the chip to the other side thereof when said chip is oriented in accordance with the orientation of said collet, for down-counting in accordance with a predetermined rate from said pre-set value upon detection of said first transit, and responsive to the detection of said second transition for stopping counting and providing its contents as a digital output; and converting means for converting said digital output of said counting means to an analog signal comprising said control signals for said motor means.

10. In the chip bonding unit of claim 9 wherein said detecting means is a differentiation circuit.

* * * * *

UNITED STATES PATENT AND TRADEMARK OFFICE
CERTIFICATE OF CORRECTION

PATENT NO. : 4,103,814

DATED : August 1, 1978

INVENTOR(S) : Hideya Nishioka

It is certified that error appears in the above-identified patent and that said Letters Patent are hereby corrected as shown below:

In the heading of the patent, item [30], "Oct. 5, 1975" should read --May 10, 1975--.

*Signed and Sealed this*

*Twenty-fourth* Day of *April 1979*

[SEAL]

Attest:

RUTH C. MASON
*Attesting Officer*

DONALD W. BANNER
*Commissioner of Patents and Trademarks*